United States Patent
Tsuzuki

(10) Patent No.: US 9,815,405 B2
(45) Date of Patent: Nov. 14, 2017

(54) VEHICLE APPROACH ALERT DEVICE

(71) Applicant: ANDEN CO., LTD., Anjo, Aichi-pref. (JP)

(72) Inventor: Haruyuki Tsuzuki, Anjo (JP)

(73) Assignee: ANDEN CO., LTD., Anjo (JP)

( * ) Notice: Subject to any disclaimer, the term of this patent is extended or adjusted under 35 U.S.C. 154(b) by 1 day.

(21) Appl. No.: 14/786,564

(22) PCT Filed: May 16, 2013

(86) PCT No.: PCT/JP2013/003120
§ 371 (c)(1),
(2) Date: Oct. 23, 2015

(87) PCT Pub. No.: WO2014/184828
PCT Pub. Date: Nov. 20, 2014

(65) Prior Publication Data
US 2016/0075278 A1    Mar. 17, 2016

(51) Int. Cl.
*B60Q 1/26* (2006.01)
*B60Q 5/00* (2006.01)
*H03G 3/20* (2006.01)

(52) U.S. Cl.
CPC ............... *B60Q 5/008* (2013.01); *H03G 3/20* (2013.01)

(58) Field of Classification Search
CPC .................................. B60Q 5/008; H03G 3/20
See application file for complete search history.

(56) References Cited

U.S. PATENT DOCUMENTS 5,635,903 A * 6/1997 Koike .................... A63H 17/34
340/384.1
5,889,475 A * 3/1999 Klosinski ............. G08G 1/0965
340/902

(Continued)

FOREIGN PATENT DOCUMENTS

JP    2009-035195 A    2/2009
JP    2011-207390 A    10/2011

(Continued)

OTHER PUBLICATIONS

International Search Report and Written Opinion of the International Searching Authority dated Aug. 20, 2013 for the corresponding international application No. PCT/JP2013/003120(and English translation).

(Continued)

*Primary Examiner* — Quang D Pham
(74) *Attorney, Agent, or Firm* — Posz Law Group, PLC

(57) ABSTRACT

A vehicle approach alert device includes: an output sound generator that generates a sound output of output sound data read out from a memory device; a voltage control unit that changes a voltage of an output waveform of the sound output, and outputs a voltage control output; an amplifier that flows current, corresponding to the voltage control output, to a sound output body to output a vehicle approach alert sound; an acceleration operation amount obtaining device; a change amount calculation device that calculates a temporal change amount of the acceleration operation amount; an output sound control device that sets an envelope frequency of the vehicle approach alert sound based on the temporal change amount; and a change control device that controls the voltage control unit to change the voltage according to the envelope frequency.

5 Claims, 3 Drawing Sheets

(56) References Cited

U.S. PATENT DOCUMENTS

| | | | | |
|---|---|---|---|---|
| 7,979,147 B1* | 7/2011 | Dunn | G10K 15/02 | 181/192 |
| 8,248,273 B2* | 8/2012 | Hayashi | G08G 1/04 | 340/435 |
| 2003/0220722 A1* | 11/2003 | Toba | G10K 15/02 | 701/1 |
| 2011/0133954 A1* | 6/2011 | Ooshima | G08G 1/0967 | 340/905 |
| 2011/0188663 A1 | 8/2011 | Nakayama | | |
| 2011/0304445 A1* | 12/2011 | Nakayama | B60Q 5/008 | 340/425.5 |
| 2012/0050020 A1* | 3/2012 | Konet | B60Q 5/008 | 340/384.1 |
| 2012/0062391 A1* | 3/2012 | Pan | H03G 3/32 | 340/901 |
| 2012/0068836 A1* | 3/2012 | Konet | G10K 15/02 | 340/425.5 |
| 2012/0092185 A1* | 4/2012 | Hayashi | B60Q 5/008 | 340/904 |
| 2012/0130580 A1* | 5/2012 | Omote | G10K 15/02 | 701/22 |
| 2012/0223832 A1* | 9/2012 | Nakayama | G10K 15/02 | 340/463 |
| 2013/0038435 A1* | 2/2013 | Muroya | G10K 15/02 | 340/425.5 |
| 2013/0214920 A1* | 8/2013 | Konet | B60Q 5/008 | 340/466 |
| 2013/0216054 A1* | 8/2013 | Inoue | H03G 3/00 | 381/61 |
| 2013/0315418 A1* | 11/2013 | Nakayama | B60Q 5/008 | 381/86 |
| 2014/0085071 A1* | 3/2014 | Tsuzuki | G10K 15/02 | 340/466 |
| 2014/0233745 A1* | 8/2014 | Kanehara | B60L 15/20 | 381/61 |
| 2014/0300455 A1* | 10/2014 | Tsuzuki | B60Q 5/008 | 340/425.5 |
| 2015/0035660 A1* | 2/2015 | Sakakibara | B60Q 5/008 | 340/425.5 |
| 2015/0061850 A1* | 3/2015 | Omote | B60Q 5/008 | 340/425.5 |
| 2015/0353007 A1* | 12/2015 | Inoue | G10K 15/02 | 381/61 |
| 2016/0075278 A1* | 3/2016 | Tsuzuki | H03G 3/20 | 340/463 |
| 2016/0217689 A1* | 7/2016 | Young | G08G 1/0965 | |
| 2016/0229339 A1* | 8/2016 | Funayama | B60R 21/013 | |
| 2016/0229340 A1* | 8/2016 | Sakakibara | B60Q 5/008 | |

FOREIGN PATENT DOCUMENTS

| | | |
|---|---|---|
| JP | 2012-218661 A | 11/2012 |
| JP | 2012-232699 A | 11/2012 |
| JP | 2013-126780 A | 6/2013 |
| WO | 2014/184827 A1 | 11/2014 |
| WO | 2014/184829 A1 | 11/2014 |

OTHER PUBLICATIONS

Office Action dated Oct. 15, 2014 in the corresponding JP application No. 2011-275999 (and English translation).

* cited by examiner

VEHICLE APPROACH ALERT DEVICE

CROSS REFERENCE TO RELATED APPLICATION APPLICATIONS

This application is a U.S. national stage of International Application No. PCT/JP2013/003120 filed on May 16, 2013 and is based on Japanese Patent Application No. 2011-275999 filed on Dec. 16, 2011, the disclosures of which are incorporated herein by reference.

TECHNICAL FIELD

The present disclosure relates to a vehicle approach alert device for alerting in a surrounding area by outputting a sound from a vehicle that the vehicle approaches.

BACKGROUND ART

Recently, an electric vehicle (i.e., EV) and a hybrid vehicle (i.e., HV) have a structure for generating a small noise. Thus, it is difficult for a pedestrian to find these vehicles approaching the pedestrian. In order to increase a recognition degree of the vehicle disposed near and around the pedestrian or the like, the vehicle approach alert device for generating pseudo driving sound is mounted on these vehicles (see, for example, Patent Literature 1). In the vehicle approach alert device, a method for outputting sound is a method for outputting the sound by setting a coded data, which is prepared by converting and coding the output sound data such as PCM data (i.e., pulse code modulation data) stored in a memory of a microcomputer, i.e., converting and coding the magnitude of the sound to a data code, into a D/A converter and a PWM output device. Further, in the vehicle approach alert device, an output of the pseudo driving sound is performed when a road noise is small and the vehicle speed is low. When the vehicle is in an acceleration state, the vehicle approaches rapidly, and therefore, the risk for the pedestrian increases. Thus, the musical pitch (i.e., output sound pitch) is increased according to the increase of the vehicle speed, or the sound pressure is changed according to the acceleration operation condition of a driver, so that the effect of "fluctuation" of sound is added. Thus, the pedestrian easily find the approach of the vehicle, and further, the pedestrian can suppose the driving condition of the vehicle.

When the sound pressure is controlled according to the acceleration opening degree in order to imagine the acceleration state of the vehicle, the sound pressure may increase rapidly if the driver operates to press an acceleration pedal drastically. Accordingly, the pedestrian may be surprised more than necessary, and/or the ambient noise may increase, so that antinomy occurs.

PRIOR ART LITERATURES

Patent Literature

Patent Literature 1: JP-2009-35195 A

SUMMARY OF INVENTION

It is an object of the present disclosure to provide a vehicle approach alert device for informing a surrounding area about an acceleration condition of a vehicle without surprising a pedestrian more than necessary nor increasing an ambient noise even when a sound pressure is changed according to an acceleration opening degree.

According to an aspect of the present disclosure, a vehicle approach alert device for alerting an approach of a vehicle by outputting a vehicle approach alert sound, includes: an output sound generator that reads out output sound data from a memory device for storing the output sound data, and generates a sound output of the output sound data; a voltage control unit that changes a voltage of an output waveform of the sound output of the output sound data, which is output from the output sound generator, and outputs a voltage control output; an amplifier that controls a sound output body to output the vehicle approach alert sound by flowing current, corresponding to the voltage control output from the voltage control unit, to the sound output body mounted on the vehicle; an acceleration operation amount obtaining device that obtains an acceleration operation amount; a change amount calculation device that calculates a temporal change amount of the acceleration operation amount based on the acceleration operation amount obtained by the acceleration operation amount obtaining device; an output sound control device that sets an envelope frequency of the vehicle approach alert sound based on the temporal change amount of the acceleration operation amount calculated by the change amount calculation device; and a change control device that controls the voltage control unit to change the voltage of the output waveform of the output sound according to the envelope frequency.

The above vehicle approach alert device sets the envelope frequency of the vehicle approach alert sound according to the temporal change speed of the acceleration operation amount, and changes the voltage of the output waveform of the sound output according to the envelope frequency, so that the device changes the voltage level of the output waveform of the sound output according to the envelope frequency. Thus, the acceleration condition of the vehicle operated by a driver can be relatively estimated by the change of the envelope frequency. Further, the voltage level does not increase to be in proportion to the acceleration opening degree, but changes according to the change of the envelope frequency. The change of the voltage level represents the change of the envelope frequency. Accordingly, the vehicle approach alert device informs a surrounding area about the acceleration condition of the vehicle without surprising a pedestrian more than necessary nor increasing an ambient noise.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

First Embodiment

Figure 1:
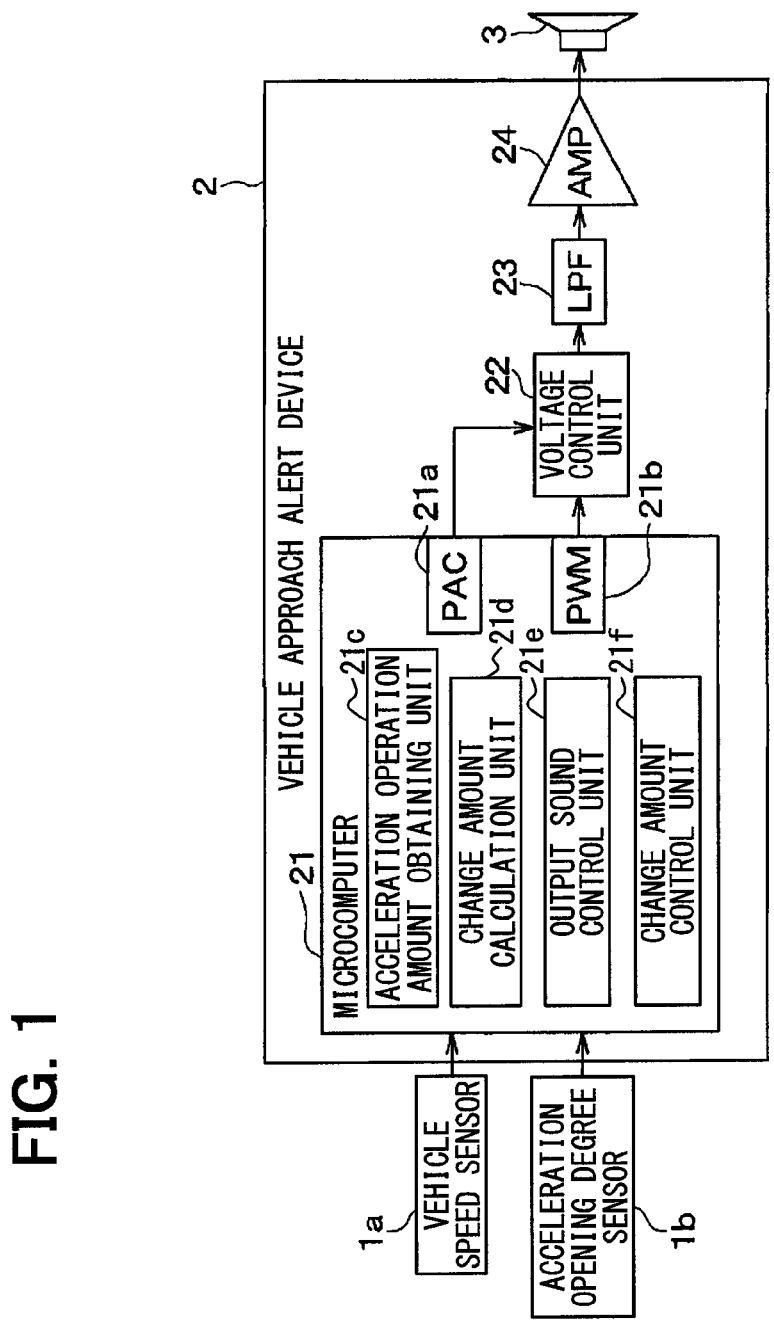
FIG. 1 is a block diagram showing a vehicle approach alert system including a vehicle approach alert device according to a first embodiment.

FIG. 1 is a block diagram showing a vehicle approach alert system including a vehicle approach alert device according to a present embodiment. With reference to the drawing, the vehicle approach alert system including the vehicle approach alert device according to the present embodiment will be explained.

As shown in FIG. 1, the vehicle approach alert system includes various sensors 1a, 1b, the vehicle approach alert device 2 and the speaker 3. In the vehicle approach alert system, the vehicle approach alert device 2 outputs a vehicle approach alert sound such as a pseudo travelling sound from the speaker 3 as a sound generator based on a travelling status detection signal transmitted from various sensors 1a, 1b when the vehicle travels with a low speed and a low road noise, so that the vehicle approach alert device 2 alerts a pedestrian or the like around the vehicle that the vehicle approaches. Here, the vehicle approach alert device 2 is separated from the speaker 3. Alternatively, the vehicle approach alert device 2 and the speaker 3 may be integrated into one body.

Various sensors 1a, 1b detect a driving condition of the vehicle. Various sensors 1a, 1b includes a vehicle speed sensor 1a and an acceleration opening degree sensor 1b. The vehicle speed sensor 1a outputs a vehicle speed detection signal of the vehicle, and the acceleration opening degree sensor 1b outputs an acceleration opening degree detection signal indicative of the acceleration opening degree as an acceleration operation amount showing an acceleration condition of the vehicle. The vehicle approach alert device 2 receives detection signals indicative of the vehicle speed and the acceleration opening degree. According to the driving condition of the vehicle such as the vehicle speed and the acceleration opening degree, the device 2 controls to output the sound.

The vehicle approach alert device 2 includes a microcomputer 21, a voltage control unit 22, a low pass filter (i.e., LPF) 23, and a power amplifier (i.e., AMP) 24.

The microcomputer 21 includes a memory corresponding to a memory device not shown and a processing device corresponding to a control unit. Further, the microcomputer 21 includes a digital-analog converter (i.e., DAC) 21a and a PWM output device 21b. The memory stores a control program for outputting sound, output sound data such as PCM data, an envelope frequency (for example, in a range between 0.125 Hz and 5 Hz) corresponding to a driving condition of the vehicle indicated by various detection signals, a reproduction speed of a waveform of an output sound, i.e., a table of a musical pitch level (e.g., in a range between 100% and 150%). Using contents of the memory, the microcomputer 21 calculates an envelope frequency corresponding to the acceleration opening degree indicated by the acceleration opening degree detection signal, and a reproduction speed (i.e., the musical pitch level) corresponding to the vehicle speed indicated by the vehicle speed detection signal. Then, the microcomputer 21 outputs the output sound through the PWM output device 21b at the calculated reproduction speed, and further, generates the output for setting the calculated envelope frequency at the DAC 21a.

Specifically, a calculation device equipped in the microcomputer 21 includes an obtaining unit 21c for obtaining the vehicle speed and the acceleration opening degree, a change amount calculation unit 21d for calculating a temporal change amount (i.e., a gradient) of the acceleration opening degree, a output sound control unit 21e for calculating the reproduction speed and the envelope frequency corresponding to the vehicle speed and the acceleration opening degree, and a change amount control unit 21f for changing the musical pitch and the sound pressure level of the sound to be output based on the calculated reproduction speed and the calculated envelope frequency.

The obtaining unit 21c inputs the vehicle speed detection signal from the vehicle speed sensor 1a and the acceleration opening degree detection signal from the acceleration opening degree sensor 1b. Based on these signals, the vehicle speed and the acceleration opening degree are obtained. Further, the change amount calculation unit 21d calculates the change amount (i.e., the gradient) of the acceleration opening degree by differentiating the acceleration opening degree, which is obtained by the obtaining unit 21c, with respect to time. For example, since the acceleration opening degree is obtained from the acceleration opening degree detection signal at every sampling cycle, the differentiation of the acceleration opening degree with respect to time is obtained by calculating the difference between the previous acceleration opening degree and the present acceleration opening degree.

The output sound control unit 21e performs determination whether the sound is output based on the vehicle speed obtained by the obtaining unit 21c and the temporal change amount of the acceleration opening degree calculated by the change amount calculation unit 21d, and sets the reproduction speed and the envelope frequency when the sound is output. Specifically, when the vehicle speed is smaller than a predetermined speed (for example, 20 km/h), in order to output the sound, the reproduction speed and the envelope frequency of the sound to be output based on the calculated vehicle speed and the temporal change amount of the calculation acceleration opening degree and the stored contents in the memory. For example, when the memory stores the table for connecting the vehicle speed and the reproduction speed and the table for connecting the temporal change amount of the acceleration opening degree and the envelope frequency, the reproduction speed and the envelope frequency corresponding to the vehicle speed and the temporal change amount of the acceleration opening degree, respectively, are selected using the table. Alternatively, a calculation equation may be stored instead of the table. In this case, by assigning the vehicle speed and the temporal change amount of the acceleration opening degree into the calculation equation, the reproduction speed and the envelope frequency corresponding to the vehicle speed and the temporal change amount of the acceleration opening degree, respectively, are calculated.

Basically, regarding the reproduction speed, as the vehicle speed increases, the reproduction speed is set to increase, so that the musical pitch level also increases. Regarding the envelope frequency, as the temporal change amount becomes large, the envelope frequency is set to increase in a case where the temporal change amount (i.e., gradient) of the acceleration opening degree is positive. The envelope frequency is set to be a minimum value (for example, 0.125 Hz) in a case where the temporal change amount (i.e., gradient) of the acceleration opening degree is negative or zero.

The change amount control unit 21f reads out the output sound data stored in the memory at every sampling cycle corresponding to the reproduction speed calculated by the output sound control unit 21e, and sets the sound pressure level of sound to be output based on the calculated envelope frequency. Specifically, when the output sound data is read out at every sampling cycle corresponding to the calculated reproduction speed, the musical pitch corresponding to the reproduction speed is set. Further, when the voltage level of the output waveform of the output sound is set based on the calculated envelope frequency, the sound pressure level is adjusted according to the envelope frequency. Thus, the "fluctuation" of sound is generated.

Thus, when the output sound data is read out with the reproduction speed corresponding to the vehicle speed, the PWM output device 21b outputs the PWM output corresponding to the read output sound data, and further, the DAC 21a outputs the control signal for setting the voltage level of the output waveform of the output sound, which is set based on the envelope frequency corresponding to the temporal change amount of the acceleration opening degree. Specifically, the control signal output from the DAC 21a is changed according to the voltage level calculated in the above manner. Thus, the control signal is changed such that, as the voltage level of the output waveform of the output sound increases, the voltage level (i.e., voltage) generated at the voltage control unit 22 becomes high, and as the voltage level of the output waveform of the output sound decreases, the voltage level generated at the voltage control unit 22 becomes low. Thus, the voltage generated at the voltage control unit 22 is controlled.

The voltage control unit 22 controls the voltage level of the PWM output based on the control signal transmitted from the DAC 21a. The unit 22 changes the voltage level of the PWM output to be the voltage level indicated by the control signal. Accordingly, for example, as the sound pressure level of the output sound becomes small, the voltage level of the PWM output is reduced. Then, the voltage control unit 22 outputs the PWM output.

The LPF 23 corresponds to a filter, so that the LPF 23 removes the noise component having a high frequency, and generates the output corresponding to the output of the PWM output device 21b transmitted via the voltage control unit 22. For example, the LPF 23 storages the voltage corresponding to the output of the voltage control unit 22 in a built-in capacitor, and outputs the stored voltage to the amplifier 24.

The amplifier 24 flows current, which corresponds to the output of the LPF 23, through the speaker 3 according to the voltage application from the constant voltage source not shown. The sound pressure of the sound to be output from the speaker 3 is determined by the magnitude (i.e., the amplitude) of current supplied from the amplifier 24. The magnitude of the current supplied from the amplifier 24 is determined by the output waveform of the LPF 23 corresponding to the PWM output. Accordingly, the current to be flown by the amplifier 24 is controlled based on the adjustment of the voltage level at the voltage control unit 22.

Figure 2:
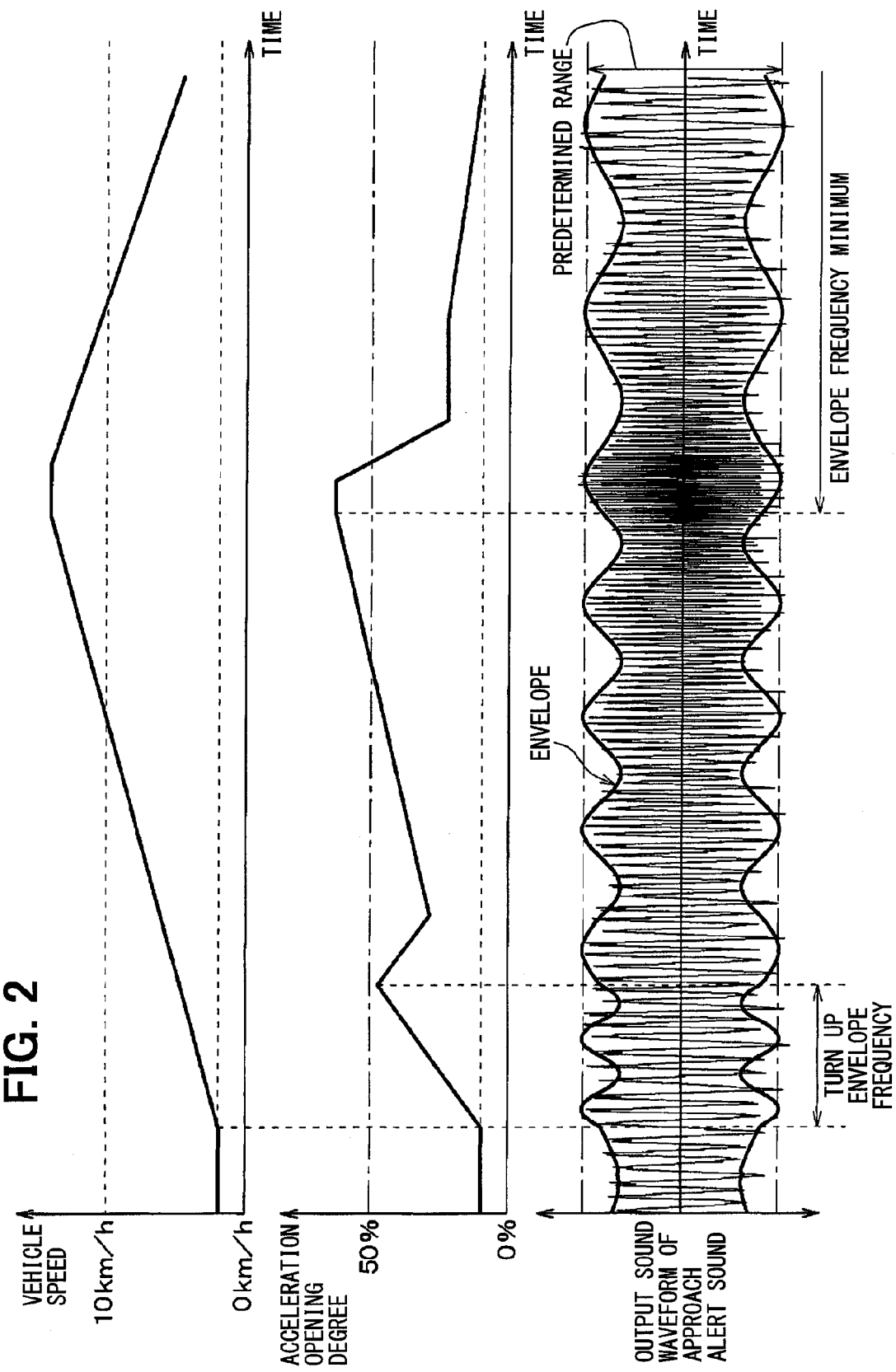
FIG. 2 is a timing chart showing a waveform of sound to be output, a change of a vehicle speed and a change of an acceleration opening degree.

According to the above features, the vehicle approach alert system including the vehicle approach alert device according to the present embodiment is constructed. The vehicle approach alert system having the above construction functions as follows. With reference to FIG. 2, the operation of the vehicle approach alert system will be explained.

Figure 3:
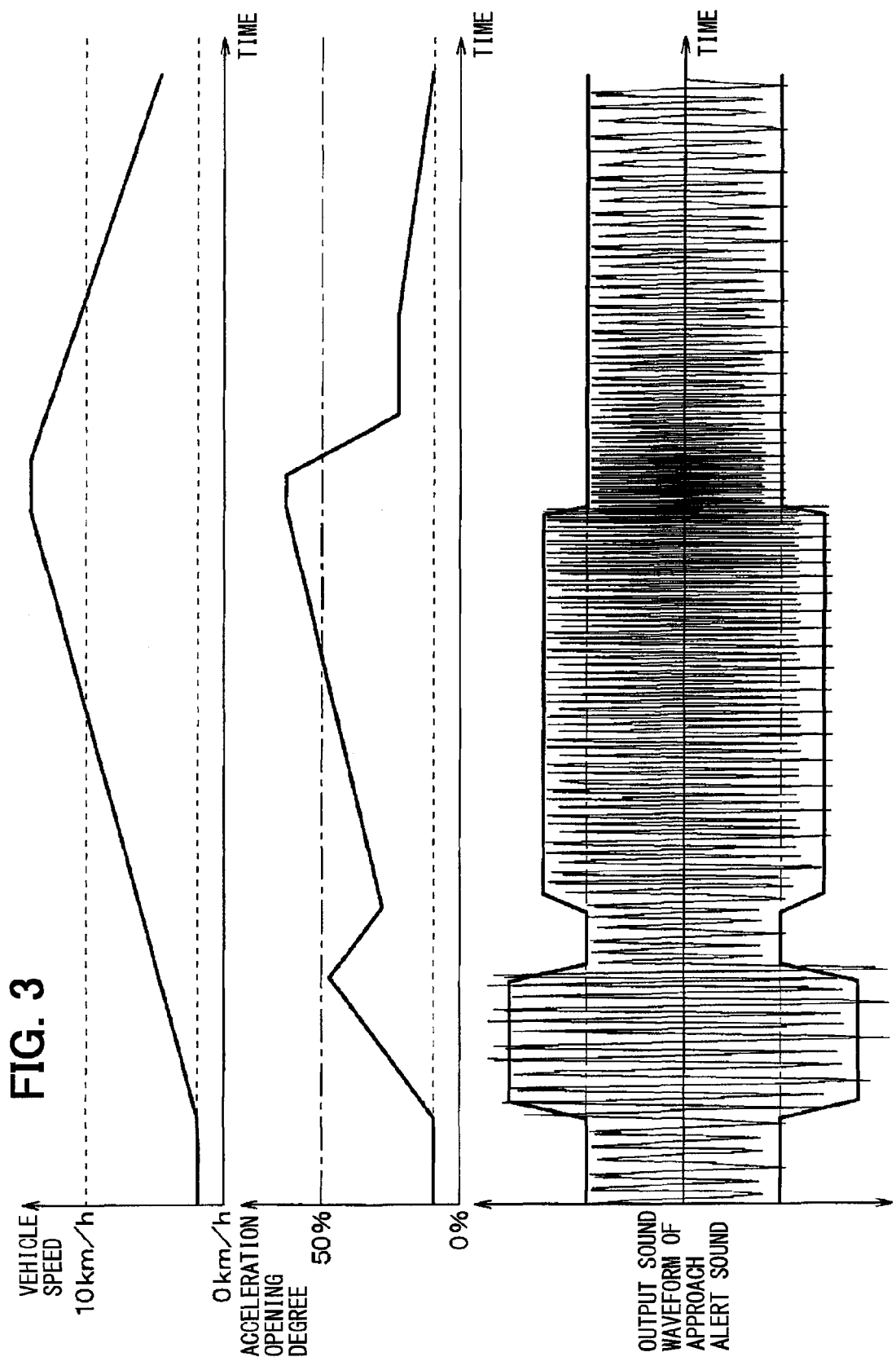
FIG. 3 is a timing chart showing a waveform of sound to be output, a change of a vehicle speed and a change of an acceleration opening degree when the sound pressure is controlled according to the acceleration opening degree.

FIG. 2 is a timing chart showing the waveform of the sound to be output, the change of the acceleration opening degree, and the change of the vehicle speed. FIG. 3 shows a comparison example. FIG. 3 is a timing chart showing the change of the vehicle speed, the change of the acceleration opening degree and the waveform of the sound to be output when the sound pressure is controlled according to the acceleration opening degree.

As shown in FIG. 2, as the vehicle speed increases, the reproduction speed increases. Thus, when the reproduction speed of the output sound data increases, and the oscillating cycle of the waveform of the sound shown in the drawing is shortened, the waveform represents as a dense state. Specifically, when the reproduction speed of the output sound data increases together with the increase of the vehicle speed, the musical pitch is increased.

Further, as shown in FIG. 2, since the envelope frequency is also increased in a period during which the speed of the temporal change amount of the acceleration opening degree is large, the oscillating cycle of the envelope frequency is shortened (in a period shown as turning up of the envelope frequency in the drawing). On the other hand, since the envelope frequency is set to be minimum in a period during which the speed of the temporal change amount of the acceleration opening degree is small, the oscillating cycle of the envelope frequency is lengthened (in a period shown as the envelope frequency minimum in the drawing).

Thus, since the reproduction speed of the vehicle approach alert sound is changed according to the vehicle speed, the musical pitch increases as the speed of the vehicle approaching the pedestrian or the like increases. Thus, the pedestrian can suppose the speed of the vehicle approaching the pedestrian relatively with reference to the change of the musical pitch. Since the envelope frequency of the approach alert sound is set according to the speed of the temporal change of the acceleration opening degree, and the voltage level of the output waveform of the output sound is changed according to the envelope frequency, the acceleration operation state of the vehicle, i.e., the acceleration operation of the driver is estimated relatively by the change of the envelope frequency.

As described above, the vehicle approach alert device according to the present embodiment sets the envelope frequency of the approach alert sound according to the speed of the temporal change of the acceleration opening degree, and changes the voltage level of the output waveform of the output sound according to the envelope frequency. Accordingly, the acceleration state of the vehicle operated by the driver is relatively supposed by the change of the envelope frequency.

Thus, the envelope frequency of the approach alert sound is changed according to the speed of the temporal change of the acceleration opening degree, and the voltage level of the output waveform of the output sound is set according to the change of the envelope frequency. In this case, the voltage level is not increased to be in proportion to the acceleration opening degree, but the voltage level is changed in a predetermined range in accordance with the change of the envelope frequency. Thus, the change of the envelope frequency is presented according to the change of the voltage level. Accordingly, the acceleration condition of the vehicle is noticed to surrounding area without surprising the pedestrian more than necessary, nor increasing the ambient noise.

Here, the envelope frequency is changed in a range between 0.125 Hz and 5 Hz, for example. Since this frequency range is set, the envelope frequency is slow so that the envelope of the output sound is easily recognized or imagined by a human. Thus, the pedestrian recognizes the change of the envelope frequency more easily.

Other Embodiments

In the above embodiment, the microcomputer 21 performs the output of the control signal using the DAC 21a, and performs the voltage control of the voltage control unit 22 by generating the control signal for changing the sound pressure at the DAC 21a. Alternatively, the voltage control of the voltage control unit 22 may be performed using the PWM controller. When the PWM controller is used, and the voltage level of the output waveform of the output sound is changed according to the temporal change amount of the acceleration opening degree, for example, the duty ratio of the on-state and the off-state of the PWM output may be changed according to the acceleration opening degree, and the sampling cycle of the PWM output may be changed.

Further, the acceleration opening degree is detected as the acceleration operation amount indicative of the acceleration condition of the vehicle. Alternatively, other physical quantities indicative of the acceleration operation amount such as the pressing amount of an acceleration pedal may be detected, and the envelope frequency may be increased when the acceleration operation amount indicates that the acceleration operation is performed to accelerate the vehicle, and the envelope frequency may be minimized when the acceleration operation amount indicates that the acceleration operation is performed to decelerate the vehicle or to be zero.

The above disclosure has the following aspects.

According to an aspect of the present disclosure, a vehicle approach alert device for alerting an approach of a vehicle by outputting a vehicle approach alert sound, includes: an output sound generator that reads out output sound data from a memory device for storing the output sound data, and generates a sound output of the output sound data; a voltage control unit that changes a voltage of an output waveform of the sound output of the output sound data, which is output from the output sound generator, and outputs a voltage control output; an amplifier that controls a sound output body to output the vehicle approach alert sound by flowing current, corresponding to the voltage control output from the voltage control unit, to the sound output body mounted on the vehicle; an acceleration operation amount obtaining device that obtains an acceleration operation amount; a change amount calculation device that calculates a temporal change amount of the acceleration operation amount based on the acceleration operation amount obtained by the acceleration operation amount obtaining device; an output sound control device that sets an envelope frequency of the vehicle approach alert sound based on the temporal change amount of the acceleration operation amount calculated by the change amount calculation device; and a change control device that controls the voltage control unit to change the voltage of the output waveform of the output sound according to the envelope frequency.

The above vehicle approach alert device sets the envelope frequency of the vehicle approach alert sound according to the temporal change speed of the acceleration operation amount, and changes the voltage of the output waveform of the sound output according to the envelope frequency, so that the device changes the voltage level of the output waveform of the sound output according to the envelope frequency. Thus, the acceleration condition of the vehicle operated by a driver can be relatively estimated by the change of the envelope frequency. Further, the voltage level does not increase to be in proportion to the acceleration opening degree, but changes according to the change of the envelope frequency. The change of the voltage level represents the change of the envelope frequency. Accordingly, the vehicle approach alert device informs a surrounding area about the acceleration condition of the vehicle without surprising a pedestrian more than necessary nor increasing an ambient noise.

Alternatively, the change control device may change the voltage of the output waveform of the output sound within a predetermined range according to the envelope frequency.

Alternatively, the output sound control device may increase the envelope frequency when the temporal change amount of the acceleration operation amount is changed to accelerate the vehicle; and the output sound control device may set the envelope frequency to be a minimum value when the temporal change amount of the acceleration operation amount is changed to decelerate the vehicle or to be zero. Thus, the envelope frequency of the vehicle approach alert sound is set according to the temporal change speed of the acceleration operation amount, and the voltage level of the output waveform of the sound output is changed according to the envelope frequency.

Alternatively, the acceleration operation amount obtaining device may obtain a vehicle speed. The output sound control device sets a reproduction speed of the sound output based on the vehicle speed, which is obtained by the acceleration operation amount obtaining device. The output sound control device controls the output sound generator to read out the output sound data at every sampling cycle corresponding to the reproduction speed. Thus, since the reproduction speed of the approach alert sound is changed according to the vehicle speed, the musical pitch increases as the speed of the vehicle approaching the pedestrian or the like increases. Thus, the pedestrian can suppose the speed of the vehicle approaching the pedestrian relatively with reference to the change of the musical pitch.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A vehicle approach alert device for alerting an approach of a vehicle by outputting a vehicle approach alert sound, comprising:
    an output sound generator that reads out output sound data from a memory device for storing the output sound data, and generates a sound output of the output sound data;
    a voltage control unit that changes a voltage of an output waveform of the sound output of the output sound data, which is output from the output sound generator, and outputs a voltage control output;
    an amplifier that controls a sound output body to output the vehicle approach alert sound by flowing current, corresponding to the voltage control output from the voltage control unit, to the sound output body mounted on the vehicle;
    an acceleration operation amount obtaining device that obtains an acceleration operation amount;
    a change amount calculation device that calculates a temporal change amount of the acceleration operation amount based on the acceleration operation amount obtained by the acceleration operation amount obtaining device;
    an output sound control device that sets an envelope frequency of the vehicle approach alert sound based on the temporal change amount of the acceleration operation amount calculated by the change amount calculation device; the envelope frequency of the vehicle approach alert sound being a range of frequency of a predetermined frequency range corresponding to the acceleration operation amount; and a change control device that controls the voltage control unit to change the voltage of the output waveform of the sound output according to the envelope frequency, wherein:

the output sound control device increases the envelope frequency when the temporal change amount of the acceleration operation amount is changed to accelerate the vehicle; and the output sound control device sets the envelope frequency to be a minimum value in the predetermined frequency range when the temporal change amount of the acceleration operation amount is changed to decelerate the vehicle or to be zero.

2. The vehicle approach alert device according to claim 1, wherein:

the acceleration operation amount obtaining device obtains a vehicle speed;

the output sound control device sets a reproduction speed of the sound output based on the vehicle speed, which is obtained by the acceleration operation amount obtaining device; and the output sound control device controls the output sound generator to read out the output sound data at every sampling cycle corresponding to the reproduction speed.

3. The vehicle approach alert device according to claim 1, wherein an envelope outlining the output waveform of the vehicle approach alert sound oscillates at the envelope frequency.

4. The vehicle approach alert device according to claim 1, wherein the output sound control unit is further configured to determine a gradient of the acceleration operation amount with respect to time, wherein the acceleration operation amount is an acceleration opening degree of the vehicle, increase the envelope frequency of the vehicle approach alert sound when the gradient of the acceleration operation amount with respect to time is increased.

5. The vehicle approach alert device according to claim 1, wherein the output sound control device is configured to increase or decrease the output waveform of the sound output, which is generated from the output sound data that is read out from the memory device, to be within the envelope frequency.

* * * * *